United States Patent

Hiller

[11] Patent Number: 5,168,459
[45] Date of Patent: Dec. 1, 1992

[54] ADAPTIVE FILTER USING CONTINUOUS CROSS-CORRELATION

[75] Inventor: Donald R. Hiller, Lake Stevens, Wash.

[73] Assignee: Hewlett-Packard Company, Palo Alto, Calif.

[21] Appl. No.: 883,895

[22] Filed: May 12, 1992

Related U.S. Application Data

[63] Continuation of Ser. No. 637,899, Jan. 3, 1991, abandoned.

[51] Int. Cl.⁵ .................. G06F 15/31; G06F 15/336
[52] U.S. Cl. ..................... 364/724.19; 364/728.03
[58] Field of Search ............... 364/724.01, 724.19, 364/724.20, 728.03, 728.06

[56] References Cited

U.S. PATENT DOCUMENTS

| 4,038,536 | 7/1977 | Feintuch | 364/724.19 |
| 4,321,686 | 3/1982 | Horna | 364/724.19 |
| 4,377,793 | 3/1983 | Horna | 364/724.19 |
| 4,947,362 | 8/1990 | Bui | 364/724.19 |

OTHER PUBLICATIONS

Honig et al., *Adaptive Filters*, Excerpt from book, Sections 3.1 and 3.2, pp. 48-53, 1985.

Primary Examiner—Long T. Nguyen

[57] ABSTRACT

Coefficients of an adaptive filter are updated continuously during the filter's normal operation. This is achieved by superimposing on the filter input signal a known noise signal. At the filter's output, a counterpart of this known noise signal is subtracted and the resultant signal is cross correlated with past samples of the noise signal. The filter coefficients are then updated in response to these correlations so as to minimize correlation of the resultant signal with the noise signal.

20 Claims, 3 Drawing Sheets

ADAPTIVE FILTER USING CONTINUOUS CROSS-CORRELATION

CROSS REFERENCE TO RELATED APPLICATION

This is a continuation of copending application Ser. No. 07/637,899 filed on Jan. 03, 1991, now abandoned.

FIELD OF THE INVENTION

The present invention relates to adaptive filters, and more particularly relates to a method and apparatus for adapting the characteristics of such filters in response to continuous stimulation with known noise signals.

BACKGROUND AND SUMMARY OF THE INVENTION

Adaptive filters are well known in the art and are commonly used in a number of applications. Usually, such filters are implemented in finite impulse response (FIR) form where the FIR coefficients are dynamically variable in response to detected characteristics of the filter output signal.

One illustrative application of an adaptive filter is as an equalizer for an imperfect analog anti-alias filter. In many electronic signal measurement instruments, such as Fourier-based spectrum analyzers, anti-alias filters are used to low-pass analog input signals prior to their conversion into digital form (in which form the signals are subsequently processed). This filtering is necessary so the conversion process does not yield image terms that alias back into the measurement band of interest.

While effective in attenuating signals above a cutoff frequency, analog anti-alias filters (and indeed nearly all analog filters) lack the perfectly flat passband response and phase linearity required by signal analysis instruments. Instead, signals in the passband exhibit increasing degrees of attenuation, ranging from small to substantial, with irregular phase characteristics.

One way to compensate for the non-ideal spectral response is to cascade after the anti-alias filter and the analog-to-digital converter a digital filter that has a spectral response equal but opposite that of the analog filter, emphasizing the signal components in proportion to their earlier attenuation, up to near the cutoff frequency. By this arrangement, the flatness and phase linearity of the instrument's response is maintained.

The digital filter in the foregoing instrumentation application is desirably made adaptive so that its characteristics may be changed as the characteristics of the anti-alias filter change. (The characteristics of the anti-alias filter may change either with age or temperature, or by substitution with another anti-alias filter). To update the filter coefficients, the prior art suggests stimulating the filter with a known signal and adjusting the filter coefficients to achieve the desired output signal. For example, the cascaded combination of the analog anti-alias filter and the digital equalization filter may be stimulated with a wideband signal, such as a chirp signal or a whitened noise signal, and the filter coefficients may be adjusted until the output signal has the same spectral composition as the input signal.

A significant disadvantage with the foregoing procedure, and indeed with many prior art methods of programming the coefficients of adaptive filters, is that a dedicated calibration cycle is required in which the usual input signal is interrupted and a known calibration signal is applied instead. It is far preferable to be able to program the filter coefficients dynamically while filtering the signal the filter was intended to process. While this has been achieved in limited instances in the prior art by fortuitous a priori knowledge of some characteristic of the input data signal, this is not generally the case.

In accordance with the present invention, the coefficients of an adaptive filter are updated continuously during the filter's normal operation. This is achieved by superimposing on the input data signal a known noise signal. At the filter's output, a counterpart of this known noise signal is subtracted and the resultant signal is cross correlated with past samples of the noise signal. The filter coefficients are then updated in response to these correlations so as to minimize correlation of the resultant signal with the noise signal.

The foregoing and additional features and advantages of the present invention will be more readily apparent from the following detailed description, which proceeds with reference to the accompanying drawings.

DETAILED DESCRIPTION

Figure 1:
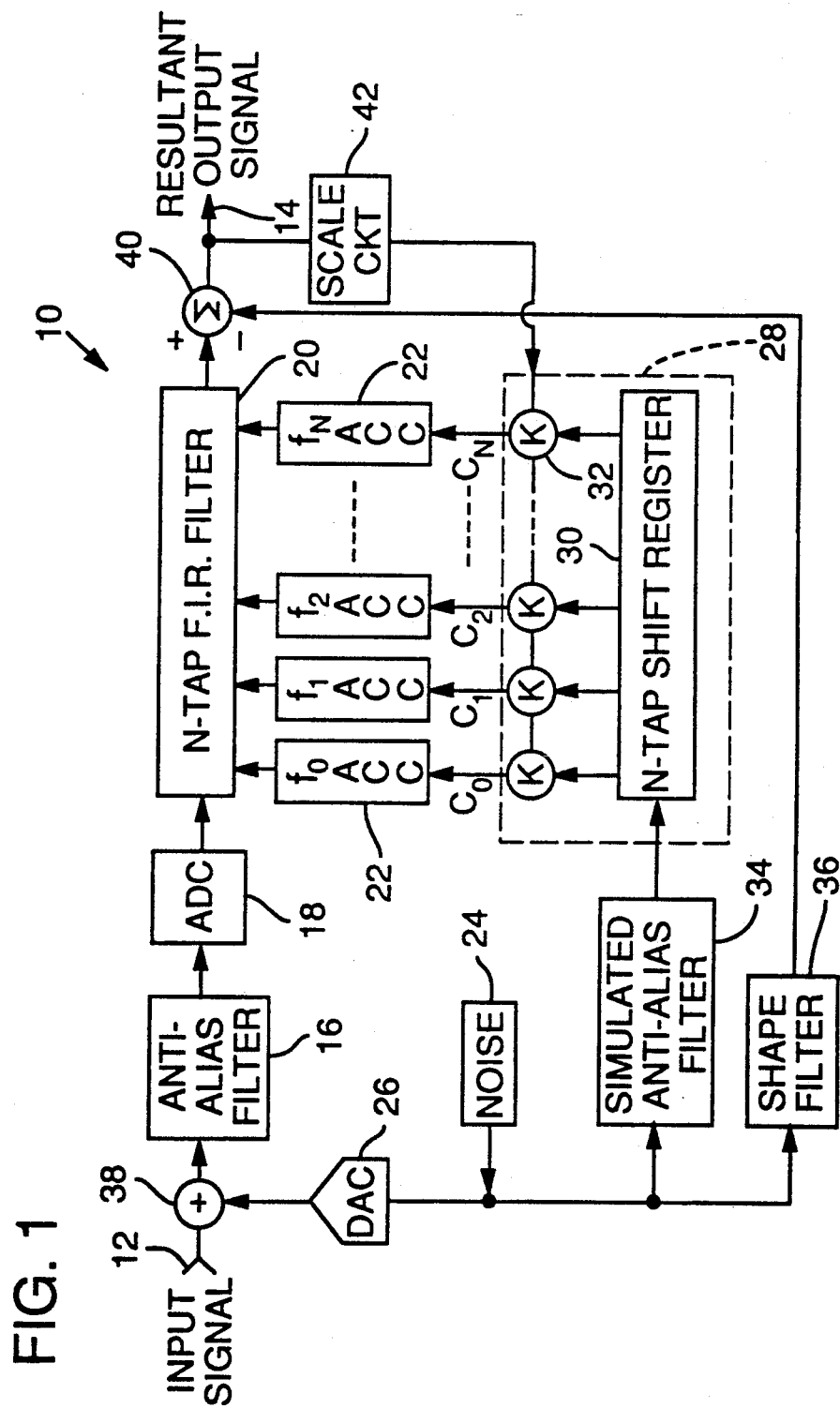
FIG. 1 is a schematic block diagram of an adaptive filtering system according to one embodiment of the present invention.

Referring to FIG. 1, an adaptive filter system 10 according to one embodiment of the present invention includes an input "12, and output 14, an analog anti-alias filter "16, an analog-to-digital converter (ADC) 18, an N-tap finite impulse response filter 20 with its filter coefficients $f_0 - f_N$ stored in N associated accumulators 22, a digital noise source 24, a digital-to-analog converter (DAC) 26, a cross-correlator 28 comprised of an N-tap shift register 30 and a series of logic units 32, a simulated anti-alias filter 34, a shape filter 36, an analog summer 38, a digital difference circuit 40, and a digital scaling circuit 42.

The signal applied to the input terminal 12 is an arbitrary analog signal which is to be converted into digital form. In the illustrated embodiment, this circuitry is provided as the front end of a signal analysis instrument that characterizes the spectral composition of an input signal over a measurement band of interest. Such instruments now make extensive use of digital signal processing techniques, thus requiring input signals to be first converted into digital form.

Prior to conversion by ADC 18, the input signal is band limited by the anti-alias filter 16 to attenuate high frequency components that would otherwise alias back down into the measurement band of interest. Aliasing is an anomaly of sampled data systems wherein signal components sampled at a rate $F_{sample}$ less than twice their frequency are spectrally mirrored about $f_{sample}/2$ and thus appear to be low frequency signals.

The anti-alias filter 16 is intended to attenuate the components of the input signal that extend above $f_{sample}/2$ so that their aliases mirrored in the measurement band are of negligible consequence. Typically such filters have an attenuation of 80 dB or more for signals at and above $f_{sample}/2$.

Since the input signal has not yet been converted into digital form, the anti-alias filter 16 must be implemented with analog circuitry. While it is possible to achieve the desired attenuation in the cutoff band using analog filter topologies, the passband characteristics suffer. As shown in FIG. 2A, the analog anti-alias filter amplitude response generally decreases with frequency throughout the passband, although the response is irregular. The filter's phase function is worse, introducing large phase shifts, especially in multi-pole filters that are optimized to yield flattest amplitude response. Since the measurement band of interest may span several octaves, the relative amplitudes and phases of different spectral components of the input signal may be significantly distorted.

To compensate for this distortion, a digital equalization filter 20 is cascaded after the analog filter/ADC combination and is programmed, by coefficients stored in accumulators 22, to have an effect equal but opposite that of the analog filter (FIG. 2B). The net effect (FIG. 2C) is to yield an ideal composite filter response: ruler flat amplitude response over the measurement band of interest, together with linear phase response.

The key to proper equalization is, of course, proper programming of the digital filter coefficients. In the illustrated embodiment of the present invention, this is accomplished in real time by continuously adding to the input signal a known noise signal, subtracting the noise signal from the composite filter output signal", and adapting the coefficients to null noise remaining in the resulting output signal.

The known noise signal is here provided by a single bit pseudo random noise signal source 24. An analog counterpart of this noise signal is provided by the DAC 26 and is summed with the input signal applied to terminal input 12 by the analog summer circuit 38. This composite signal is filtered by the cascaded filters 16, 20 and the resulting raw output signal is applied to the input of the digital difference circuit 40. From this raw output signal is subtracted a first digital counterpart to the noise signal, which is provided from the shape filter 36 discussed more fully below. The result of this subtraction is the "resultant" signal, which is output to terminal "14 and is also fed back to the correlator circuit 28.

If the coefficients of the filter 20 are selected properly, the noise component of the raw filter output signal should have the same spectral composition (at least in the band of interest) as the original noise signal (i.e. the net response of the cascaded filters should not alter the noise's phase or amplitude characteristics). After the counterpart noise signal is subtracted by the digital difference circuit 40, the resultant signal should be the band limited digital counterpart to the input analog signal, with the noise component precisely cancelled therefrom.

As will become more fully apparent below, the above-described system 10 operates as a feedback loop that servos the noise component of the resultant signal to be zero. It does this by forcing the transfer function from the noise generator 24 to the circuit output 14 to be exactly the same through two paths: path (a) through the cascaded filters, and path (b) through the shape filter 36. Since the transfer function through the cascaded filters is variable, while the transfer function through the shape filter 36 is fixed, the former will converge to match the latter.

The manner in which the coefficients of filter 20 adapt to effect this convergence is next described.

The fundamental premises on which operation of the illustrated system is based are that the noise signal is an uncorrelated random variable and that it is uncorrelated to the input signal.

The uncorrelated random limitation means simply that, at any point in the noise signal waveform, it is equally likely that the next sample will be a "0" as a "1". A corollary of this premise is that, over time, the noise signal has an average value midway between the two binary states, or 0.5.

The uncorrelated limitation means simply that the input signal is not even remotely a function of the noise signal (or vice versa). A corollary of this premise is that the averaged value of the input signals when the noise signal is a "1" is exactly the same as the averaged value of input signals when the noise signal is a "0".

To simplify the following analysis, and the resulting hardware, the noise signal against which correlation is determined is considered to have binary states of $+1$ and $-1$, rather than "1" and "0". The long term average of this noise signal thus becomes zero.

Given these premises, it can be seen that the sum of a series defined as the product of the noise signal times the input data signal each clock period, if considered over a long enough time period, will approximately equal zero. That is:

$$(NOISE)*(INPUT) \simeq 0$$

Since the noise signal is either $+1$ or $-1$ (with equal likelihood), this summation can be likened to either adding or subtracting the value of the input signal from an accumulator, depending on whether the noise signal is $+1$ or $-1$, respectively. Over time, the value accumulated in the accumulator will tend towards zero.

Just as the input signal is uncorrelated to the noise signal, so too should be the input signal after band limiting by the cascaded filters (i.e. the "resultant" signal in FIG. 1.) Consequently, if the resultant signal is added to an accumulator each clock period for which the noise signal is a "1", and is subtracted from the accumulator each clock period for which the noise signal is a "$-1$", the accumulator should tend towards zero.

If such an accumulator does not tend towards zero, but instead continually increases, this indicates the resultant signal is, on average, larger when the noise signal is "$+1$" than when it is "$-1$". Conversely, if the accumulator continually decreases, this indicates the resultant signal is, on average, larger when the noise signal is "$-1$" than when it is "$+1$". Either condition indicates undesired correlation between the resultant signal and the noise signal.

Before proceeding further, it is helpful to review the operation of the filter 20 and the manner in which a correlation between the resultant signal and the noise signal would be manifested.

Figures 2, 3:
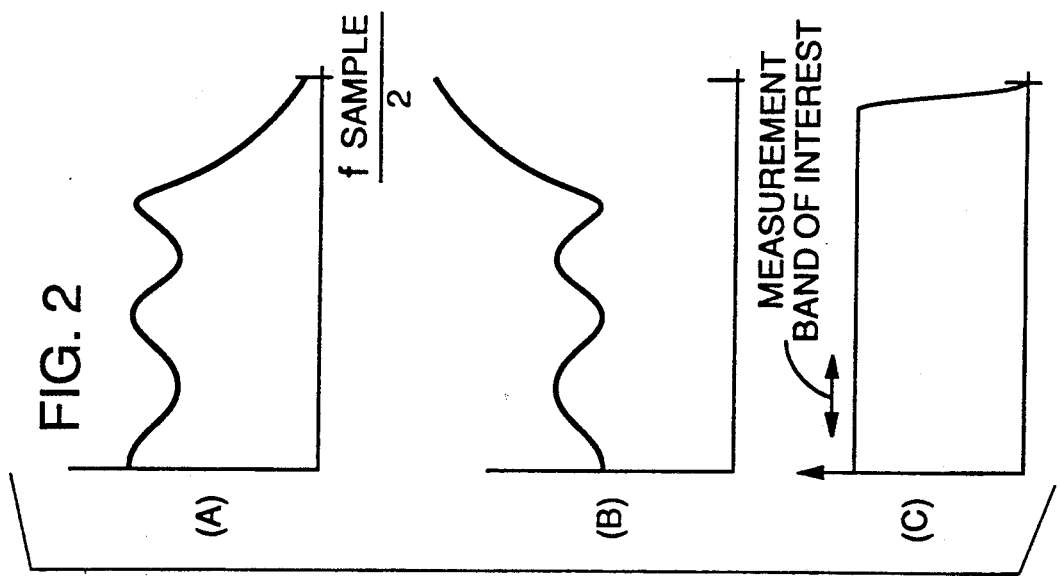
FIG. 2 is a family of curves illustrating the amplitude responses of (A) a typical analog anti-alias filter, (B) a equalization filter, and (C) the cascaded combination of (A) and (B).
FIG. 3 is a block diagram of a digital filter that may be used as the equalization filter in the system of FIG. 1.

As is familiar to those skilled in the art, filter 20 operates by weighting a plurality of delayed signal samples with stored filter coefficients, and summing the weighted samples to produce an output datum once each clock period. A block diagram of such a filter is shown in FIG. 3, where $f_0$, $f_1$, $f_2$ ... $f_N$ are the stored weighting coefficients. In the illustrated embodiment, these coefficients are stored in the accumulators 22 and are continually refined by accumulants $c_0, c_1, c_2 ... c_N$, discussed below, that are accumulated therewith.

The resultant signal is thus a function not just of the present value of the composite signal (the composite signal being the summed input signal and the noise signal)", but also of its value in several (N−1, where N is the number of taps in filter 20) preceding clock periods. Correlation may thus exist not only between the resultant signal and the current noise sample, but also between the resultant signal and N−1 previous noise samples.

To discern the correlation that may exist between the present resultant signal and several past noise samples, an accumulator technique like that discussed above is replicated N times, once for each of the past N noise samples. A shift register 30 is employed in which the past N noise samples are shifted and are available on N output terminals. These N output terminals correspond to the N accumulators 22 and the N taps of the filter 20. Each clock cycle, the logic units 32 subtract the resultant signal from those accumulators for which the historical noise signal sample on the corresponding output of the shift register is a "1", and add the resultant signal to those accumulators for which the corresponding historical noise signal sample is a "−1". (It will be recognized that the addition/subtraction operations have here been transposed. This is necessary for convergence of the accumulator values. The same underlying theories still hold, viz: $(NOISE)*(INPUT) = (-1)*(NOISE)*(INPUT) \approx 0$.)

If the filter is properly programmed, the noise signal subtracted by the digital difference circuit 40 exactly cancels the noise component of the filter output signal. If one of the filter's weighting coefficients is too large or too small, however, the cancellation will be incomplete and the resultant signal will include a small noise component.

Assume, for sake of example, that all of the filter coefficients are correct except for $f_2$, and that $f_2$ has a value 10% greater than it should be. Thus, each composite signal sample, when it is processed in the $z^{-2}$ stage of the filter 20 (FIG. 3), contributes disproportionately to the filter output signal, making the filter output slightly larger than it should be (to an extent depending on the value of the composite signal sample). If the composite signal sample being processed in the $z^{-2}$ stage has a noise component of "0", this noise component will not be exaggerated in the filter output signal (110% of 0 is still 0). Subtraction of the noise signal in digital difference circuit 40 will thus proceed normally. If, however, the composite signal being processed in the $z^{-2}$ stage includes a noise sample component of "1", this noise component will be exaggerated by 10%. When the noise signal is subtracted from the filter output signal in digital difference circuit 40, the 10% excess contribution added by the presence of the "1" noise signal will persist uncancelled in the resultant output signal. The net effect is that the resultant signal will be very slightly larger when the noise component of the composite signal being processed in the $z^{-2}$ stage is a "1" than when it is a "0".

The result of this slight difference is that the value of the resultant signals subtracted from the $f_2$ accumulator exceed the values of the signals added to the $f_2$ accumulator by a slight amount, causing the value of the coefficient stored in the $f_2$ accumulator to drift downwardly, towards the correct value. Once this correct value is reached, the phenomenon described above disappears and the accumulator is thereafter incremented and decremented by like amounts, keeping its value more or less stationary.

The above-described process is in effect continuously with each of the N coefficient accumulators, tweaking each filter coefficient upwardly or downwardly in response to imbalances between the average resultant signal values when the noise sample corresponding to each coefficient is a "0" versus when it is a "1".

"Tweaking" is a misnomer if the full resultant signal value is used to variously increment and decrement the coefficient accumulators 22 each clock cycle, since the resultant signal can be quite large. While the long term average of the accumulators may represent the proper coefficients, the instantaneous value would generally be off by a large margin.

To rectify this problem, digital scaling circuit 14 is employed to reduce the resultant signal by several hundred or thousand-fold prior to incrementing or decrementing the accumulators. In a preferred form of the invention, the scaling circuit is a programmable bit shifter. Initially following power up of the circuit 10, the bit shifter is programmed to operate in its coarse mode, such as by dividing by 128 (7 bit positions). After several thousand samples have been processed at this rate, the accumulators have converged, in gross terms, to the proper coefficients. Thereafter, the bit shifter is programmed to operate in its fine mode, such as by dividing by 1028 (10 bit positions), to refine the gross coefficient estimates.

As described so far, the programmable filter 20 will adapt to compensate the anti-alias filter's non-flat response across all frequencies. However, the frequencies above the measurement band of interest are irrelevant in the present application. Further, in order for the programmable filter 20 to equalize the 20–30 dB disparity in certain spectral components of the signal filtered by the anti-alias filter 16, the coefficients of the filter 20 will themselves range from very small to very large. If the coefficients span a 100,000:1 ratio, the largest would be 16 bits longer than the smallest. To insure ruler flat response over the band of interest, all coefficients must be accurate to several decimal places, meaning the smallest coefficient may require 12 or more bits to represent. The largest coefficients would thus have twenty-four bits or more. Filters with coefficients of this length are expensive to implement due to the complex multipliers required.

Since an ideal filter response is only required over the instrument's measurement band of interest, the anti-alias filter is only equalized over this band. The resulting simplification of the filter coefficients effects a substantial simplification of the filter's internal multiplier circuitry.

Band limited-equalization is effected by providing the shape filter 36 with a band limiting transfer function. Since the transfer function of the cascaded filters is served to match that of the shape filter 36, band-limited equalization in the cascaded filters is thereby achieved. The shape filter may also be employed to correct for zero order hold shaping (i.e $\sin(x)/x$ rolloff) introduced by the sample and hold operation of the DAC 26.

To achieve the desired ruler flat amplitude response/flat phase response in the measurement band of interest, stringent demands are placed on the shape filter 36, since it is the shape filter that provides the reference "ideal" response characteristic that the cascaded filters are served to match. However, since it is filtering only a single bit data stream, the filter 36 can be an FIR filter with several hundred taps and yet be implemented fairly simply. A common implementation uses a series of read only memories addressed by shift registers through which the noise signal is clocked. FIG. 2C, which illustrates the summed responses of the anti-alias filter 16 (FIG. 2A) and the programmable equalization filter 20 (FIG. 2B), matches that of this shape filter 36.

The filter topology described above has certain similarities to adaptive filters using the LMS stochastic gradient algorithm as described, *inter alia*, in Honig et al, *Adaptive Filters*, pp. 49–52 (1984). One difference, however, is that the present invention does not correlate the resultant signal against the output signal from the anti-alias filter. Rather, the present invention correlates the resultant signal against an output signal from a simulated anti-alias filter 34 (discussed more fully below). The output of the actual anti-alias filter contains signals from circuit input 12 that are much larger than the noise terms. Therefore, they dominate over the noise terms and would cause the standard LMS adaptive filter to null stationary terms in this filter's output signal, an undesired result. The illustrated embodiment avoids this problem by use of a simulated anti-alias filter 34 to which just the noise signal is applied. As will be seen from the following analysis, the simulated anti-alias filter's approximation of the actual anti-alias filter's response need not be very exact for the design to still work.

Let the transfer function from the input terminal 12 (and from the noise source 24) through the analog anti-alias filter 16 be H(z) (when considered in the sampled time domain), where:

$$H(z) = h_0 + h_1 z^{-1} + h_2 z^{-2} + \ldots h_N z^{-N} \quad (1)$$

and $z^{-1}$ is the input signal sampled the immediately preceding clock period, etc. This is the non-ideal transfer function which the adaptive filter 20 is to equalize.

Let the transfer function of the adaptive equalization filter 20 be F(z), where:

$$F(z) = f_0 + f_1 z^{-1} + f_2 z^{-2} + \ldots f_N z^{-N} \quad (2)$$

The composite result of the two cascaded filters 16, 20 is then H(z)F(z), or:

$$h_0 f_0 + (h_0 f_1 + h_1 f_0) z^{-1} + (h_0 f_2 + h_1 f_1 + h_2 f_0) z^{-2} + \ldots \quad (3)$$

Let the transfer function of the shape filter 36 be S(z), where:

$$S(z) = s_0 + s_1 z^{-1} + s_2 z^{-2} + \ldots s_N z^{-N} \quad (4)$$

The transfer function from the noise source 24 to the circuit output terminal 14, here termed X(z), is then the difference between H(z)F(z) and S(Z), and is ultimately nulled to zero:

$$\begin{aligned} X(z) = &\ (h_0 f_0 - s_0) + (h_0 f_1 + h_1 f_0 - s_1) z^{-1} + \\ &\ (h_0 f_2 + h_1 f_1 + h_2 f_0 - s_2) z^{-2} + \ldots \end{aligned} \quad (5)$$

Let the transfer function of the simulated anti-alias filter 34 be A(z), where:

$$A(z) = a_0 + a_1 z^{-1} + a_2 z^{-2} + \ldots a_N z^{-N} \quad (6)$$

The correlator 28 multiplies the corresponding terms of A(z) and X(z) to yield the following correlation products, which accumulate with coefficients $f_0, f_1, f_2 \ldots f_N$ in the accumulators 22:

$$\begin{aligned} c_0: &\ a_0(h_0 f_0 - s_0) + a_1(h_0 f_1 + h_1 f_0 - s_1) + \\ &\ a_2(h_0 f_2 + h_1 f_1 + h_2 f_0 - s_2) + \ldots \end{aligned} \quad (7)$$

$$\begin{aligned} c_1: &\ a_0(h_0 f_1 + h_1 f_0 - s_1) + \\ &\ a_1(h_0 f_2 + h_1 f_1 + h_2 f_0 - s_2) + \ldots \end{aligned}$$

$$\begin{aligned} c_2: &\ a_0(h_0 f_2 + h_1 f_1 + h_2 f_0 - s_2) + \\ &\ a_1(h_0 f_3 + h_1 f_2 + h_2 f_1 + h_3 f_0 - s_3) + \ldots \end{aligned}$$

Provided the noise samples are uncorrelated sample to sample, then only terms with like delays correlate, resulting in the simplified product expressed in equations (7).

If the input to the correlator 28 were taken directly from the output of the actual anti-alias filter then the coefficients of the A transfer function (simulated filter 34) and the H transfer function (analog filter 16") in the above equations would be equal. The result would be that the portion of the output which depends on the filter coefficients being controlled always has the same sign, and so always converges (if the gain is chosen reasonably).

An example of the convergence requirement would be to examine the $c_0$ term. The $c_0$ result is used to control $f_0$, being accumulated (with opposite sign) into $f_0$. If $f_0$ is too large, then the $c_0$ result must increase so that it can be subtracted from the $f_0$ accumulator. Grouping only the $f_0$ terms in the $c_0$ correlation:

$$(a_0 h_0 + a_1 h_1 + a_2 h_2 + \ldots) f_0 \quad (8)$$

it is clear that $a_0$ must have the same sign as $h_0$, $a_1$ as $h_1$, etc. If they didn't, the feedback could be positive and the series would diverge instead of converge.

To summarize, the only real requirement of the simulated anti-alias filter 34 is that the sign of $a_0$ be the same as the sign of $h_0$, the sign of $a_1$ be the same as the sign of $h_1$, etc. The magnitudes are not critical to convergence. To simplify implementation, the magnitudes of $a_0, a_1 \ldots$ can all be "1". Implementation is further simplified by the fact that not all of the of the $a_0, a_1, a_2 \ldots$ terms need to be used. The minimum is just $a_0$ (provided the $h_0$ term it is simulating is non zero). If $h_0$ is positive, $a_0$ is "1". If $b_0$ is negative, $h_0$ is "−1". Since the noise is considered to be "+1" or "−1", the output of the one term simulated filter 34 is either "+1" or "−1".

Figure 4:
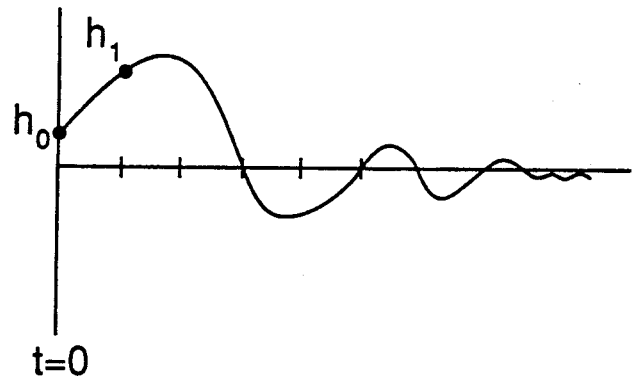
FIG. 4 is the impulse response of a representative low pass filter.

If two or more terms are used, convergence is faster. Consider the exemplary impulse response of a low pass anti-alias filter 16 illustrated in FIG. 4, from which two terms $h_0$ and $h_1$ are taken. Both $h_0$ and $h_1$ are positive, so let $a_0$ and $a_1$ both equal "+1". If the simulated filter 34 is also to effect conversion of the "0/1" binary noise signal to the "−1/+1" form, then the input and output relationships of the simulated filter are as shown in TABLE I:

TABLE I

| Current noise sample | Prior noise sample | Filter output |
|---|---|---|
| 0 | 0 | −2 |
| 0 | 1 | 0 |

TABLE I-continued

| Current noise sample | Prior noise sample | Filter output |
|---|---|---|
| 1 | 0 | 0 |
| 1 | 1 | 2 |

In this case, the +2, 0 and −2 values can be scaled to +1, 0 and −1. The logic units 32 of correlator 28 in this instance would perform one of three operations on each of the coefficient accumulators 22, depending on whether the corresponding output of the "-shift register 30 were +1, 0 or −1. For those terms for which the shift register output was +1, the logic units 32 would subtract the scaled resultant signal from the corresponding accumulator. For those terms for which the shift register output was −1, the logic units would add the scaled resultant signal to the corresponding accumulator. Finally, for those terms for which the shift register output was 0, the logic units would leave the corresponding accumulators unaltered.

Figure 5:
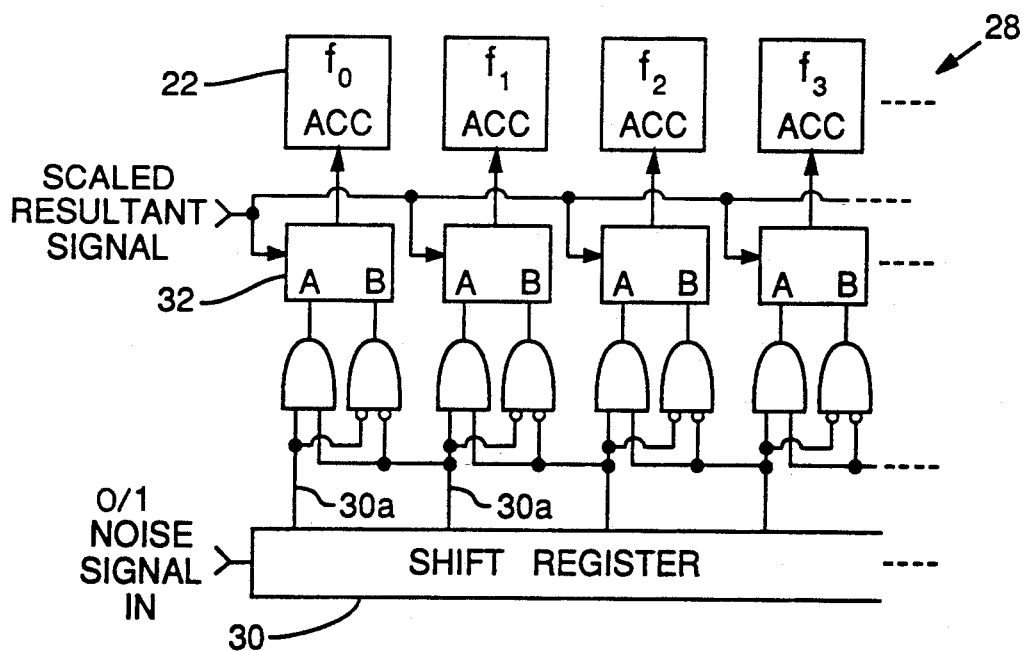
FIG. 5 is a schematic block diagram of a correlator used in the system of FIG. 1.

FIG. 5 shows a representative portion of a circuit by which the foregoing operations may be performed. The "0/1" binary noise signal is applied directly to the shift register 30. To each adjacent pair of shift register outputs 30a is coupled a network of two gates 46 that implement the logic described above. The output of one gate is connected to a terminal "A" of a logic unit 32 that enables subtraction of the scaled resultant signal from the associated accumulator. The output of the other gate is connected to a terminal "B" of the logic unit and enables addition of the scaled resultant signal to the associated accumulator.

If a more accurate implementation is desired, the values of $a_0, a_1, a_2 ...$ can be computed in advance and loaded into the hardware on power up. Alternatively, the system can sense the impulse response coefficients $h_0, h_1, h_2 ...$ of the actual filter 16 as the circuit operates and program the coefficients $a_0, a_1, a_2 ...$ of the simulated filter accordingly. By correlating the anti-alias filter output with the present noise sample, the sign of $h_0$ can be determined, since the $h_0$ term is the only one with the same delay. Likewise, the sign of $h_1$ can be found by correlating the anti-alias filter output with the noise delayed by one sample, and so on. Not only the signs but also the magnitudes of $h_0, h_1, h_2 ...$ can be estimated in value by this technique.

The hardware implementation of the illustrated embodiment can be simplified somewhat by not clocking all the circuit elements at the full sample rate. The noise source 24, simulated anti-alias filter 34, and the N-tap shift register 30 must run at the full sample rate, but the correlator circuit 28 and the shape filter 36 can operate on one point out of M. The reduced speed of convergence is not material if the sample rate is high enough.

Having described and illustrated the principles of my invention with reference to a preferred embodiment, it will be recognized that the invention can be modified in arrangement and detail without departing from such principles. For example, while the invention has been illustrated with reference to a system employing a single bit pseudo random noise signal as the noise stimulus, it will be recognized any other signal uncorrelated with the input signal and having a known mean value can alternatively be used. Similarly, while the invention has been illustrated with reference to a hardware implementation, it will be recognized that other applications may best be served performing the method in software. A hybrid implementation uses field reprogrammable gate array devices, such as are available from Xilinx, Inc. that can be reconfigured as necessary. Finally, while the invention has been illustrated with reference to an equalization filter for an anti-alias filter, it will be recognized that this is but one of numerous applications to which the invention can be applied.

Allowed pending application of Hilton, Ser. No. 07/442,379, filed Nov. 27, 1989, has a lengthy discussion detailing the necessary and sufficient conditions for a noise source suitable as source 24. The Hilton application is incorporated herein by reference.

In view of the many possible embodiments to which the principles of my invention may be put, it should be recognized that the detailed embodiment is illustrative only and should not be taken as limiting the scope of my invention. Rather, I claim as my invention all such embodiments as may come within the scope and spirit of the following claims and equivalents thereto.

I claim:

1. A method of tailoring the characteristics of an adaptive filter so that electronic signals filtered thereby are transformed in a desired manner, the method comprising:
    applying to the adaptive filter a composite signal that includes a data signal and a known pseudo random signal;
    determining a cross correlation between a filtered signal resulting from said applying step and the known pseudo random signal; and
    varying coefficients of the adaptive filter based on said cross correlation;
    wherein the variation of the adaptive filer coefficients based on the cross correlation tailors the characteristics of the adaptive filter so that the data signal filtered thereby is transformed in a desired manner.

2. A method of programming an adaptive filter having a plurality of filter coefficients so that electronic signals filtered thereby are transformed in a desired manner, the method comprising:
    applying to the filter an input data signal;
    superimposing on the input data signal a known noise signal;
    removing from a filtered output signal a counterpart to the known noise signal to thereby produce a resultant output signal;
    detecting artifacts of the known noise signal in the resulting signal; and
    adapting the filter coefficients to minimize said artifacts, said adapting step occurring continuously during normal operation of the filter rather than in a dedicated calibration cycle.

3. The method of claim 2 in which the detecting step includes cross correlating the resultant output signal with a counterpart to the known noise signal.

4. A method of filtering with an adaptive filter so as to transform an electrical data signal in a desired manner, the method comprising:
    superimposing a noise signal on a data signal applied to an input of the adaptive filter;
    subtracting a counterpart to said noise signal from a signal output from the adaptive filter to produce a resultant signal;
    determining a correlation between the resultant signal and past samples of the noise signal; and updating coefficients of the adaptive filter in response to said correlation so as to minimize correlation of the resultant signal with the noise signal.

5. A method of calibrating an anti-alias filter so as to reduce undesired responses thereof, the method comprising the steps:
filtering an analog data signal with an analog anti-alias filter;
converting the filtered signal into digital form;
compensating an imperfect response of the analog anti-alias filter by passing the digital signal through a digital compensation filter; and
programming the digital compensation filter while filtering the analog data signal, rather than while filtering a known calibration signal in a dedicated calibration cycle.

6. A method of filtering an electronic signal to transform it in a desired manner, the method comprising the steps:
applying an input signal to series coupled first and second filter stages, the first filter state having a response that roughly approximates a desired filter response, the second filter stage having a response that can be programmed by varying coefficients associated therewith;
applying a noise signal to a third filter stage to yield a filtered noise signal, the third filter stage having a response that more nearly approximates the desired filter response than does the first filter stage;
applying a first counterpart to said noise signal to the cascaded first and second filter stages and producing an output signal corresponding thereto;
subtracting the filtered noise signal from said output signal to yield a resultant signal;
determining a correlation between said resultant signal and a second counterpart to said noise signal to produce accumulation signals; and
accumulating the accumulation signals to yield the coefficients of the second filter stage;
wherein the response of the second filter stage is thereby programmed so that the net response of the cascaded first and second filter stages mimics the response of the third filter stage.

7. The method of claim 6 which further includes passing a data signal through the cascaded first and second filter stages simultaneously with passing the first counterpart of the noise signal therethrough.

8. In a filtering method that includes the steps of:
filtering an analog input signal with an analog filter to pass a desired spectrum, said analog filter having an imperfect response across the desired spectrum;
converting the filtered analog signal to digital form once each clock period; and
filtering the digital signal with an N-tap finite impulse response filter to produce an output signal compensated for the imperfect response of the analog filter, the filtering step including filtering in accordance with N stored filter coefficients;
an improved method for updating the filter coefficients of the N-tap finite impulse response filter, the method comprising the steps:
providing a digital noise signal that alternates between first and second values;
summing an analog counterpart of the noise signal with the analog input signal prior to analog filtering;
coupling a first digital counterpart of the noise signal to an N-tap shift register, said register having N outputs through which the first counterpart signal is shifted as the shift register is clocked once each clock period;
subtracting a second digital counterpart of the noise signal from the output signal of the N-tap finite impulse response filter to produce a digital difference signal;
scaling the digital difference signal;
processing the scaled digital difference signal and the N outputs of the N-tap shift register to produce N correction factors corresponding to the N filter coefficients; and
updating the filter coefficients with the correction factors corresponding thereto.

9. The method of claim 8 in which the first digital counterpart of the noise signal is different than the second digital counterpart of the noise signal.

10. The method of claim 8 in which the processing step includes cross correlating the scaled digital difference signal with the first digital counterpart of the noise signal.

11. The method of claim 8 which further includes:
subtracting the scaled difference signal from each of the filter coefficients for which the corresponding output of the N-bit shift register has the first value; and
summing the scaled difference signal with each of the filter coefficients for which the corresponding output of the N-bit shift register has the second value.

12. The method of claim 8 in which the updating step is performed less frequently than once each clock period.

13. The method of claim 8 in which the processing step is performed less frequently than once each clock period.

14. The method of claim 8 in which the subtracting step is performed less frequently than once each clock period.

15. The method of claim 8 which further includes generating the second digital counterpart signal by filtering the digital noise signal with a desired filter shape.

16. The method of claim 8 which further includes:
generating a first digital counterpart signal having at least three possible signal values, the sequence of values that define said signal being a function, at least in part, of preceding values of the digital noise signal;
shifting the first digital counterpart signal through the shift register;
subtracting the scaled difference signal from each of the filter coefficients for which the corresponding output of the shift register has the first value;
summing the scaled difference signal with each of the filter coefficients for which the corresponding output of the shift register has the second value; and
leaving unaltered the filter coefficients for which the corresponding output of the shift register has the third value.

17. An adaptive filer for tailoring phase and amplitude response of a circuit, the filter comprising:
an N-tap finite impulse response filter whose filtering characteristics are determined by N filter coefficients stored in a memory, the filter being serially coupled with the circuit whose response is to be tailored, the serial combination having an input and an output;
a noise source having an output;

the output of the noise source being coupled to the input of said serial combination;

the output of the noise source and the output of the serial combination being coupled to inputs of a difference circuit, said difference circuit having an output;

a cross correlation circuit having a first input coupled to the output of the difference circuit and having a second input coupled to the output of the noise source, the cross correlation circuit having an output coupled to the memory in which the N filter coefficients are stored.

18. The filter of claim 17 which further include a model filter that exhibits a characteristic to be mimicked by the serial combination, said model filter being serially interposed between the output of the noise source and the input of the difference circuit.

19. The filter of claim 17 which further includes a signal processor serially interposed between the noise source and the second input of the cross correlation circuit.

20. The filter of claim 17 which further includes a scaling circuit serially interposed between the output of the difference circuit and the first input of the cross correlation circuit.

* * * * *